United States Patent
Ariyama

(10) Patent No.: US 10,283,303 B2
(45) Date of Patent: May 7, 2019

(54) FUSE CIRCUIT AND SEMICONDUCTOR INTEGRATED CIRCUIT DEVICE

(71) Applicant: Seiko Instruments Inc., Chiba-shi, Chiba (JP)

(72) Inventor: Minoru Ariyama, Chiba (JP)

(73) Assignee: ABLIC INC., Chiba (JP)

(*) Notice: Subject to any disclaimer, the term of this patent is extended or adjusted under 35 U.S.C. 154(b) by 210 days.

(21) Appl. No.: 14/190,612

(22) Filed: Feb. 26, 2014

(65) Prior Publication Data

US 2014/0240080 A1 Aug. 28, 2014

(30) Foreign Application Priority Data

Feb. 26, 2013 (JP) ................................. 2013-036212

(51) Int. Cl.
*H01H 85/02* (2006.01)
*H01L 23/525* (2006.01)

(52) U.S. Cl.
CPC . *H01H 85/0241* (2013.01); *H01H 2085/0283* (2013.01); *H01L 23/5256* (2013.01)

(58) Field of Classification Search
CPC ........ H01H 85/0241; H01H 2085/0283; H01L 23/5256
USPC ........................................................ 337/292
See application file for complete search history.

(56) References Cited

U.S. PATENT DOCUMENTS

| 5,151,611 A * | 9/1992 | Rippey ............... H01L 23/5256 |
| | | 257/E23.149 |
| 6,255,893 B1 * | 7/2001 | Dishongh .......... G01R 31/3004 |
| | | 327/525 |
| 7,351,595 B2 * | 4/2008 | Ishii ....................... H01L 22/14 |
| | | 257/E21.531 |
| 7,529,147 B2 | 5/2009 | Ueda |
| 2001/0017755 A1 * | 8/2001 | Toyoshima ......... H01L 27/0255 |
| | | 361/56 |
| 2002/0021126 A1 * | 2/2002 | Ishibashi ................ G01R 33/07 |
| | | 324/251 |
| 2003/0154456 A1 * | 8/2003 | Koike ................. H01L 27/0802 |
| | | 338/308 |
| 2005/0106830 A1 * | 5/2005 | Shiiki ...................... H01L 21/84 |
| | | 438/382 |
| 2005/0169071 A1 * | 8/2005 | Kobayashi ............. G11C 5/143 |
| | | 365/200 |
| 2006/0228879 A1 * | 10/2006 | Beach .................... H01C 7/006 |
| | | 438/622 |
| 2007/0034608 A1 * | 2/2007 | Grudin ................. H01C 17/267 |
| | | 219/68 |
| 2007/0045783 A1 * | 3/2007 | Ohkubo ............. H01L 23/5252 |
| | | 257/665 |

(Continued)

FOREIGN PATENT DOCUMENTS

JP 2010-177612 A 8/2010

*Primary Examiner* — Jacob R Crum
(74) *Attorney, Agent, or Firm* — Brinks Gilson & Lione

(57) ABSTRACT

Provided is a semiconductor integrated circuit device including a fuse circuit whose area and cost are minimized by a simple circuit configuration. The fuse circuit includes a first fuse and a second fuse having substantially the same shape and different sheet resistances, which are connected in series between terminals with different potentials. In a state in which none of the fuses is cut, a potential of an output terminal is fixed to a potential of one of the terminals.

3 Claims, 5 Drawing Sheets

(56) References Cited

U.S. PATENT DOCUMENTS

| | | | | |
|---|---|---|---|---|
| 2009/0315617 A1* | 12/2009 | Rosik | ............... | G05F 3/08 |
| | | | | 327/538 |
| 2010/0014374 A1* | 1/2010 | Takase | ............... | G11C 17/16 |
| | | | | 365/225.7 |
| 2010/0164679 A1* | 7/2010 | Park | ............... | G01R 31/2884 |
| | | | | 337/297 |
| 2010/0277150 A1* | 11/2010 | Nagata | ............... | G01R 31/2884 |
| | | | | 323/282 |
| 2012/0299630 A1* | 11/2012 | Sakurai | ............... | H03H 5/12 |
| | | | | 327/306 |
| 2012/0319591 A1* | 12/2012 | Wu | ............... | H05B 37/0218 |
| | | | | 315/149 |

\* cited by examiner

| Cut Fuse | N1 | N4 | N5 |
|---|---|---|---|
| F1 | 0 | 1 | 1 |
|  |  | 0 | 0 |
| F2 | 1 | 1 | 0 |
|  |  | 0 | 1 |

FUSE CIRCUIT AND SEMICONDUCTOR INTEGRATED CIRCUIT DEVICE

RELATED APPLICATIONS

This application claims priority under 35 U.S.C. § 119 to Japanese Patent Application No. 2013-036212 filed on Feb. 26, 2013, the entire content of which is hereby incorporated by reference.

BACKGROUND OF THE INVENTION

1. Field of the Invention

The present invention relates to a fuse circuit including fuses that can be cut by laser or the like, and a semiconductor integrated circuit device including the fuse circuit.

2. Description of the Related Art

A fuse circuit that can be cut by laser has been widely used for a semiconductor integrated circuit device for the purpose of characteristics adjustment or function switching. For example, in a bandgap reference voltage generation circuit, in order to correct reference voltage temperature characteristics caused by manufacturing fluctuations to obtain a high accuracy reference voltage, a fuse is cut by laser to turn on or off a switch connected to a resistor, thereby adjusting a resistance value.

FIG. 7 is a circuit diagram of a related-art fuse circuit. The related-art fuse circuit includes a resistor R1, a fuse H1, a fuse H2, and a resistor R2 that are connected in series between power supply terminals. A terminal A of the fuse circuit is connected to a switch circuit that is connected in parallel or in series to one of resistors in a bandgap reference voltage generation circuit, for example. When the terminal A becomes "High" level or "Low" level, the switch circuit is turned on or off to adjust a resistance value of the resistor in the bandgap reference voltage generation circuit, thereby adjusting reference voltage temperature characteristics. The level of the terminal A is determined by which of the fuse H1 and the fuse H2 is cut by laser. Which of the fuses is to be cut is determined after the reference voltage is measured in a stage before adjustment, that is, in a state in which none of the fuses is cut. Because a material with high conductivity is used for the fuse in general, in consideration of the area of a chip, the resistor R1 and the resistor R2 are connected for the purpose of limiting a current that flows between the power supply terminals in the state in which the fuses are not cut.

As described above, by mounting the fuse circuit that can be cut by laser on a semiconductor integrated circuit device, added value of high accuracy is realized in a bandgap reference voltage generation circuit, for example.

In recent years, however, semiconductor integrated circuit devices have been strongly required to be high in accuracy and high in performance and more strongly required to be low in cost. The cost of the semiconductor integrated circuit device is affected by the chip size, and it has therefore been required to reduce the chip size as much as possible.

In other words, the circuit has been strongly required to have as simple a configuration as possible. In such circumstances, the related-art fuse circuit as described above has a problem in that the chip size increases with an increase in adjustment parts and the cost increases.

SUMMARY OF THE INVENTION

The present invention has been made in view of the foregoing, and it is an object thereof to construct a fuse circuit by an extremely simple circuit configuration and provide a semiconductor integrated circuit device at low cost.

In order to solve the related-art problem described above, a fuse circuit according to one embodiment of the present invention includes a first fuse and a second fuse having substantially the same shape and different sheet resistances, which are connected in series between terminals with different potentials, and in a state in which the fuses are not cut, a potential of an output terminal is fixed to one of the potentials of the terminals.

According to the semiconductor integrated circuit device according to one embodiment of the present invention, by integrating the fuses including resistors having different sheet resistances on a semiconductor substrate, the fuse circuit can be constructed by an extremely simple circuit configuration. It is therefore possible to realize the semiconductor integrated circuit device with a small area at low cost.

DETAILED DESCRIPTION OF THE PREFERRED EMBODIMENTS

A semiconductor integrated circuit device including a fuse circuit according to the present invention is widely usable in an electronic circuit integrated on a semiconductor substrate, for products requiring high accuracy and advanced functions, such as a reference voltage generation circuit and a sensor circuit. One embodiment of the present invention is described below with reference to the accompanying drawings.

Figure 1A:
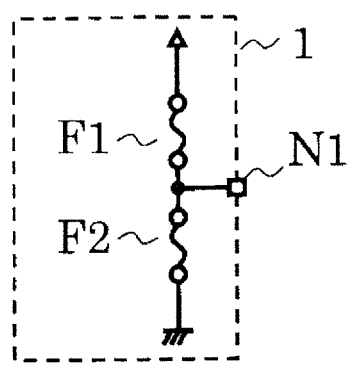
FIG. 1A is a circuit diagram of a fuse circuit according to one embodiment of the present invention.

FIG. 1 is a circuit diagram of a fuse circuit according to this embodiment.

A fuse circuit 1 includes a fuse F1 and a fuse F2. The fuse F1 and the fuse F2 each have two connection terminals. One of the connection terminals of each fuse is connected in common. A connection point of the connection terminals is an output terminal N1 of the fuse circuit 1. The other connection terminals of the fuses are connected to wirings of different potentials. For description, the different potentials are referred to as "potential VSS" and "potential VDD" higher than the potential VSS. The fuse F1 has a resistance value Rf1, the fuse F2 has a resistance value Rf2, and the output terminal N1 has a potential V1.

In this case, a resistor of the fuse F1 has a sheet resistance higher than a sheet resistance of a resistor of the fuse F2, and the fuse F1 and the fuse F2 have substantially the same layout shape.

The fuse circuit 1 according to this embodiment is configured as described above, and operates as follows.

In a state in which the fuse F1 and the fuse F2 are not cut, the potential V1 of the output terminal N1 and a current IF flowing from VDD to VSS via the fuse F1 and the fuse F2 are expressed by the following expressions.

$$V1-VSS=Rf2/(Rf1+Rf2)\times(VDD-VSS) \quad (1)$$

$$IF=(VDD-VSS)/(Rf1+Rf2) \quad (2)$$

Figure 1B:
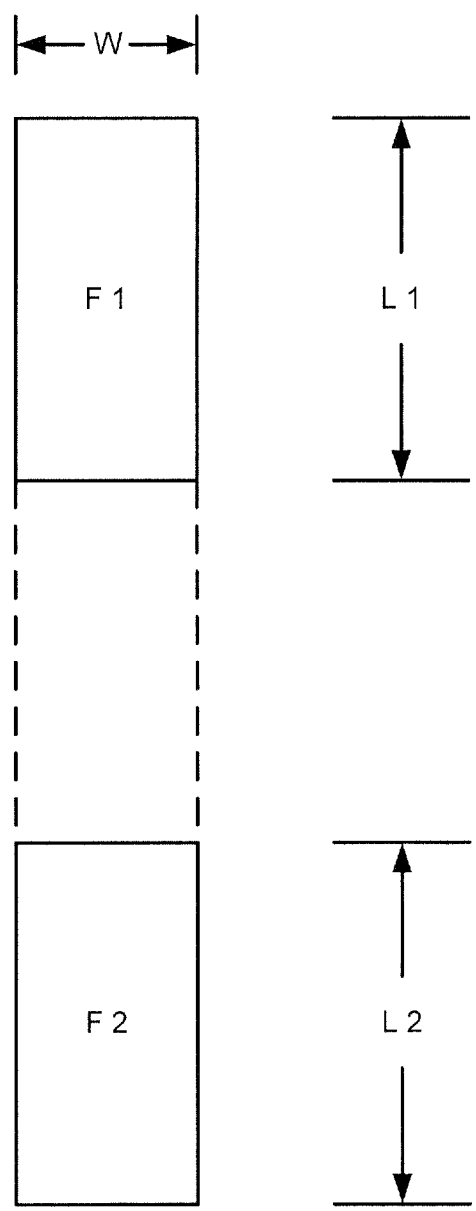
FIG. 1B is plan view of the fuses shown in FIG. 1A.

The resistance value of the resistor is determined by the sheet resistance and the width W and length L of the resistor. As illustrated in FIG. 1B, the fuse F1 and the fuse F2 have substantially the same layout shape, and hence the width W and the length L are substantially the same, and the sheet resistance of the resistor of the fuse F1 is higher than the sheet resistance of the resistor of the fuse F2. In other words, the resistance value Rf1 is larger than the resistance value Rf2. Thus, in the state in which none of the fuses is cut, the potential V1 of the output terminal N1 becomes closer to VSS with respect to a midpoint potential between VDD and VSS.

In a state in which one of the fuse F1 and the fuse F2 is cut, the potential V1 of the output terminal N1 becomes substantially equal to VSS or VDD. The current IF flowing from VDD to VSS via the fuse F1 and the fuse F2 becomes substantially equal to zero.

Figure 2:
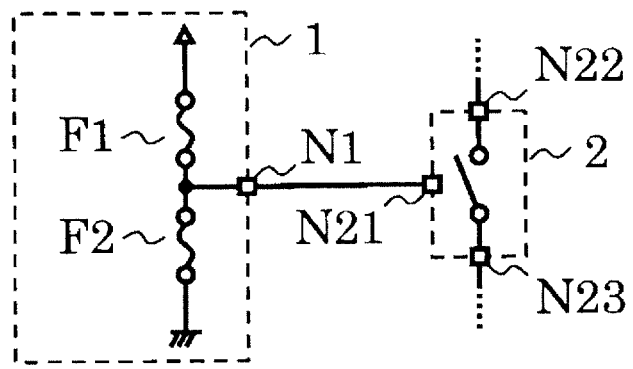
FIG. 2 is a circuit diagram illustrating an exemplary semiconductor integrated circuit device including the fuse circuit according to one embodiment of the present invention.

FIG. 2 is a circuit diagram illustrating an exemplary semiconductor integrated circuit device including the fuse circuit according to this embodiment. The semiconductor integrated circuit device illustrated in FIG. 2 is constructed by connecting a switch circuit 2 to the output terminal N1 of the fuse circuit 1.

The switch circuit 2 is controlled to be turned on or off between a terminal N22 and a terminal N23 based on a potential of a terminal N21. In the switch circuit 2, the terminal N21 is connected to the output terminal N1 of the fuse circuit 1, and the terminal N22 and the terminal N23 are connected to an element (not shown) that is adjusted or switched based on the turning on or off of the switch. Examples of the element include a resistor, a transistor, and a capacitor integrated on a semiconductor substrate. The semiconductor integrated circuit device illustrated in FIG. 2 is configured as described above, and operates as follows.

In the state in which none of the fuse F1 and the fuse F2 is cut, the potential V1 of the output terminal N1 becomes closer to VSS with respect to the midpoint potential between VDD and VSS. The switch circuit 2 is configured to be turned on when the potential of the terminal N21 is closer to VDD with respect to the midpoint potential and be turned off when the potential of the terminal N21 is closer to VSS with respect to the midpoint potential. In the state in which none of the fuses is cut, the switch circuit 2 is turned off certainly because the potential V1 is closer to VSS with respect to the midpoint potential between VDD and VSS. Characteristics of the semiconductor integrated circuit device are measured in this state. To obtain more appropriate characteristics, whether to turn on or off the switch circuit 2 is selected. When the switch circuit 2 is to be turned on, the fuse F2 is cut by laser. When the switch circuit 2 is to be turned off, the fuse F1 is cut by laser.

Figure 3:
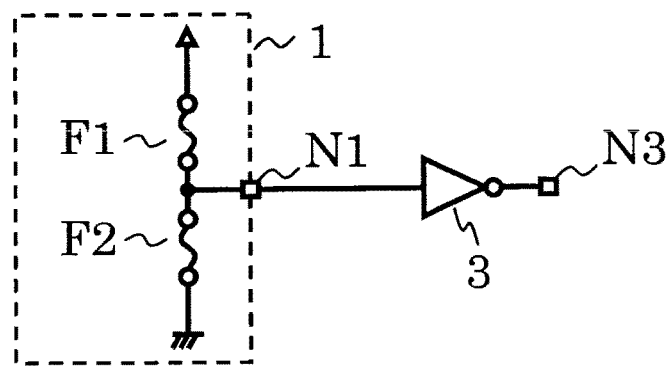
FIG. 3 is a circuit diagram illustrating another exemplary semiconductor integrated circuit device including the fuse circuit according to one embodiment of the present invention.

FIG. 3 is a circuit diagram illustrating another exemplary semiconductor integrated circuit device including the fuse circuit according to this embodiment. The semiconductor integrated circuit device illustrated in FIG. 3 is constructed by connecting a NOT circuit 3 as a logic circuit to the output terminal N1 of the fuse circuit 1.

The NOT circuit 3 has an input terminal connected to the output terminal N1 of the fuse circuit 1. Power of the NOT circuit 3 is supplied from VDD and VSS (not shown). Although not illustrated, an output terminal N3 of the NOT circuit 3 may be connected to a control terminal of the switch as illustrated in FIG. 2, or may be connected to an input of a logic circuit block for switching the function of the semiconductor integrated circuit device. The semiconductor integrated circuit device illustrated in FIG. 3 is configured as described above, and operates as follows.

In the state in which none of the fuse F1 and the fuse F2 is cut, the potential V1 of the output terminal N1 becomes closer to VSS with respect to the midpoint potential between VDD and VSS. The potential of the output terminal N3 of the NOT circuit 3 therefore becomes VDD. Characteristics of the semiconductor integrated circuit device are measured in this state. To obtain more appropriate characteristics, whether to set the potential of the output terminal N3 of the NOT circuit 3 to VDD or VSS is selected. When the potential of the output terminal N3 of the NOT circuit 3 is to be set to "VDD" level, the fuse F1 is cut by laser. When the potential of the output terminal N3 of the NOT circuit 3 is to be set to "VSS" level, the fuse F2 is cut by laser.

In the above description of this embodiment, as illustrated in FIG. 1B, the fuse F1 and the fuse F2 are simple resistors having different sheet resistances. However, the material for the fuse may be any material that can be integrated on a semiconductor substrate and can be cut by laser, for example, aluminum, copper, tungsten, or polysilicon. Examples of the material to be used include low-resistance polysilicon with a low sheet resistance, which is used for a gate of a MOS transistor or wiring between circuits, and high-resistance polysilicon, which is used for a resistor. Both low-resistance polysilicon and high-resistance polysilicon are elements that can be manufactured easily on a semiconductor substrate and are widely and commonly used. By applying low-resistance polysilicon and high-resistance polysilicon to the fuse F1 and the fuse F2, respectively, this embodiment can be realized without needing a special manufacturing process. This is very important for attaining low cost.

In the above, the configuration and operation of the semiconductor integrated circuit device according to the first embodiment of the present invention have been described, to thereby show that the fuse circuit can be realized by an extremely simple circuit configuration. A semiconductor integrated circuit device particularly requiring high accuracy or advanced functions tends to be large in adjustment parts or function switching parts and thus needs a large number of pairs of fuse circuits. Enabling the fuse circuit to be realized by an extremely simple circuit configuration has important meaning. In addition, this embodiment is extremely effective in that the fuse circuit can be realized without needing a special manufacturing process.

Note that, the description herein has been made by way of specific examples for description, but the configurations and characteristics values are not always limited to the above as long as not impairing the intent of the present invention. For example, in the description herein, in the state in which none of the fuse F1 and the fuse F2 is cut, the switch circuit 2 is controlled to be certainly turned off and the output of the NOT circuit 3 becomes "VDD" level. However, the configurations are not limited thereto. The switch circuit may be turned on instead, and the output of the NOT circuit 3 may become "VSS level" instead of "VDD level".

Further, in the above description, for simplicity, the boundary between on and off of the switch circuit 2 is the midpoint potential between VDD and VSS, and no particular mention has been made on an inversion level of the NOT circuit. However, in a semiconductor integrated circuit device manufactured on a semiconductor substrate, it is rare that the boundary between on and off of the switch and the inversion level of the NOT circuit are equal to the midpoint potential between the power supply terminals due to the fluctuations in the manufacturing process. Thus, in order to determine the on/off state of the switch or the output logic of the NOT circuit in the state in which none of the fuse F1 and the fuse F2 is cut, it is necessary to set the potential V1 of the output terminal N1 to be closer to the potential of VDD or VSS. To attain this, the materials for the fuse F1 and the fuse F2 are selected so that the ratio of the sheet resistances of the fuse F1 and the fuse F2 may be large.

For example, when the resistance value Rf1 of the fuse F1 is four times larger than the resistance value Rf2 of the fuse F2, the potential V1 of the common output terminal N1 in the state in which none of the fuses is cut is expressed as follows.

$$V1-VSS=(\tfrac{1}{5})\cdot(VDD-VSS) \qquad (3)$$

In general, this potential is sufficient for determining the state of the switch or the NOT circuit.

The case where the above-mentioned low-resistance polysilicon and high-resistance polysilicon are used is described as a more specific example. In general, low-resistance polysilicon has a sheet resistance of several $\Omega/\square$ to several tens $\Omega/\square$, and high-resistance polysilicon has a sheet resistance of several $\Omega/\square$ to several tens $\Omega/\square$. As an example, the fuse F1 is formed of high-resistance polysilicon having a sheet resistance of 10 k$\Omega/\square$, and the fuse F2 is formed of low-resistance polysilicon having a sheet resistance of 10$\Omega/\square$. In consideration that the fuses have substantially the same layout shape and can be stably cut by laser, the width W is set to 1 µm and the length L is set to 10 µm as an example. In this case, the resistance values Rf1 and Rf2 of the respective fuses are 100 k$\Omega$ and 100$\Omega$. The potential V1 of the output terminal N1 in the state in which none of the fuses is cut is expressed as follows based on Expression (1).

$$V1-VSS=(\tfrac{1}{1001})\times(VDD-VSS) \qquad (4)$$

In other words, the potential V1 is substantially equal to the potential of VSS, which is suitable in this embodiment.

The current IF flowing from VDD to VSS via the fuse F1 and the fuse F2 in the state in which none of the fuses is cut is expressed by Expression (2). When the potential difference between VDD and VSS is 5 V, the current IF is about 50 µA. It is preferred that the amount of change in current consumption before and after characteristics adjustment, that is, before and after the cut of the fuse, be as small as possible. This is because it is preferred that the change in power supply voltage caused by wiring resistances, an internal impedance in a power supply device, and a contact resistance between terminals in a measurement test environment be smaller for the measurement of the characteristics of the semiconductor integrated circuit device. Particularly when temperature characteristics are adjusted, it is not preferred that the amount of heat generation in the semiconductor integrated circuit device change before and after adjustment. This embodiment is therefore suitable in that the current flowing through the fuses in the state in which the fuses are not cut can be suppressed to be small.

Figure 4:
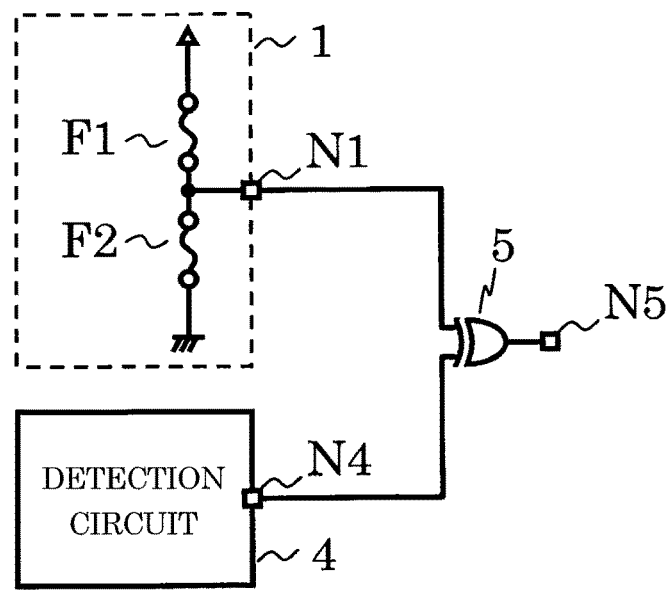
FIG. 4 is a circuit diagram illustrating another exemplary semiconductor integrated circuit device including the fuse circuit according to one embodiment of the present invention.

FIG. 4 is a circuit diagram illustrating another exemplary semiconductor integrated circuit device including the fuse circuit according to this embodiment. The semiconductor integrated circuit device according to this embodiment includes the fuse circuit 1, a detection circuit 4, and an EXOR circuit (exclusive OR circuit) 5.

The EXOR circuit 5 has two input terminals and one output terminal N5. One of the input terminals is connected to the output terminal N1 of the fuse circuit 1, and the other input terminal is connected to an output terminal N4 of the detection circuit 4. Power of the EXOR circuit 5 is supplied from VDD and VSS (not shown). The semiconductor integrated circuit device illustrated in FIG. 4 is configured as described above, and operates as follows.

For example, the detection circuit 4 detects physical quantity input from the outside, and outputs binary values indicating a detection state and a non-detection state in accordance with the physical quantity. Examples of the detection circuit 4 include a temperature detection device and a magnetic detection device. In the following, the logic value for the detection state is referred to as "1" and the logic value for the non-detection state is referred to as "0" for description.

Figures 5, 6:
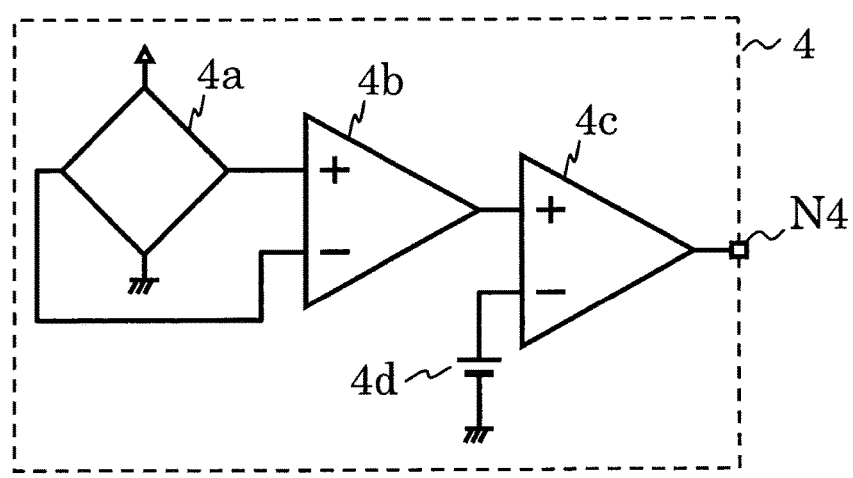
FIG. 5 is a table showing an operation of the semiconductor integrated circuit device of FIG. 4.
FIG. 6 is a circuit diagram illustrating an exemplary detection circuit of FIG. 4.
Figure 7:
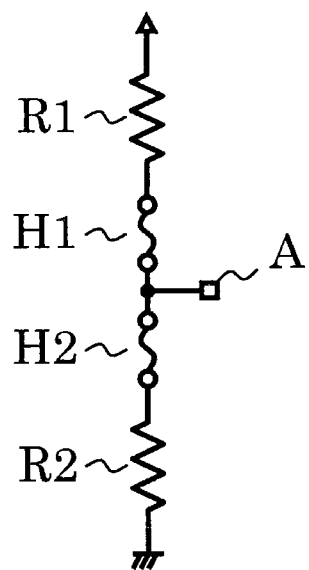
FIG. 7 is a circuit diagram of a related-art fuse circuit of a semiconductor integrated circuit device.

FIG. 5 is a table showing an operation of the semiconductor integrated circuit device illustrated in FIG. 4 in the form of logic values.

When the fuse F1 is cut, the logic value becomes "0" because the potential of the output terminal N1 becomes "VSS" level. Accordingly, the output N5 becomes "1" when the output N4 of the detection circuit 4 is "1" indicating the detection state, and the output N5 becomes "0" when the output N4 of the detection circuit 4 is "0" indicating the non-detection state. On the other hand, when the fuse F2 is cut, the logic value becomes "1" because the potential of the output terminal N1 becomes "VDD" level.

Accordingly, the output N5 becomes "0" when the output N4 of the detection circuit 4 is "1" indicating the detection state, and the output N5 becomes "1" when the output N4 of the detection circuit 4 is "0" indicating the non-detection state. In this manner, the logic values of the output N5 in the detection state and the non-detection state of the detection circuit 4 can be easily switched to positive logic or negative logic.

FIG. 6 is a circuit diagram illustrating an exemplary detection circuit 4 of FIG. 4.

The detection circuit 4 includes a Hall element 4a as a magnetoelectric conversion element, an amplifier circuit 4b, a comparator circuit 4c, and a reference voltage circuit 4d. Opposing two of the four terminals of the Hall element 4a are connected to power supply terminals. The remaining two terminals are connected to inputs of the amplifier circuit 4b. The amplifier circuit 4b has an output connected to one input of the comparator circuit 4c. The other terminal of the comparator circuit 4c is connected to one terminal of the reference voltage circuit 4d. The comparator circuit 4c has an output connected to the output terminal N4 of the detection circuit 4. The other terminal of the reference voltage circuit 4d is connected to the power supply terminal. The detection circuit 4 illustrated in FIG. 6 is configured as described above, and operates as follows.

The Hall element 4a is a magnetoelectric conversion element, and outputs a voltage corresponding to an applied magnetic field. A signal converted into a voltage by the Hall element is input to the amplifier circuit 4b to be amplified with a predetermined gain, which is then input to the comparator circuit 4c. The comparator circuit 4c compares the signal voltage obtained from the Hall element 4a to a reference voltage output from the reference voltage circuit 4d. The comparator circuit 4c outputs the logic value "1" indicating the detection state when the signal voltage from the Hall element 4a is higher, and outputs the logic value "0" indicating the non-detection state when the signal voltage from the Hall element 4a is lower. The output of the comparator circuit 4c is output from the output terminal N4 as the output of the detection circuit 4. In this manner, the detection circuit 4 operates to detect a magnetic field as the physical quantity input from the outside and output the binary values indicating the detection state and the non-detection state in accordance with the physical quantity.

Note that, in the description herein, the detection circuit 4 has the above-mentioned configuration for convenience. However, the configuration is not always limited thereto as long as the binary values indicating the detection state and the non-detection state are output in accordance with the physical quantity. Further, the magnetic field (magnetism) has been exemplified as the physical quantity to be detected by the detection circuit 4, but, for example, the physical quantity may be temperature, voltage, current, acceleration, pressure, or the like. Further, no particular description has been made on specific examples of the gain of the amplifier circuit 4b and the reference voltage output from the reference voltage circuit 4d, but the configuration of FIG. 2 or FIG. 3 may be applied so that the gain or the reference voltage may be adjustable to adjust a detection point.

In the above, the configuration and operation of the semiconductor integrated circuit device according to the second embodiment of the present invention have been described, to thereby exemplify the circuit including the fuse circuit. As described above, the semiconductor integrated circuit device is required to be high in accuracy and have advanced functions, and hence enabling the switching of the operations and functions to be realized by a simple circuit configuration has important meaning. Note that, in the description herein, the use application of switching between positive logic and negative logic of the output has been described, but the present invention may be used for the use application of switching between positive logic and negative logic of the input.

In the above, the operations of the semiconductor integrated circuit devices according to the first and second embodiments of the present invention have been described, to thereby show that the fuse circuits can be realized by extremely simple circuit configurations and exemplify the circuits including the fuse circuits. In the description herein, the specific circuit configurations and material characteristics values have been exemplified, but the configurations and characteristics values are not always limited thereto as long as the operations described herein are performed.

What is claimed is:

1. A fuse circuit incorporated into a semiconductor device, the fuse circuit comprising:
a first fuse having a first end and a second end;
a second fuse having a first end and a second end, wherein the first end of the first fuse and the first end of the second fuse are connected at an output terminal;
a first voltage source arranged to apply a first voltage to one of the second end of the first fuse or the second end of the second fuse; and
a second voltage source arranged to apply a second voltage to the other of the second end of the first fuse or the second end of the second fuse, wherein the first voltage is set higher than the second voltage,
wherein one of the first or second fuse is cut and electrically disconnected between the first and second ends thereof, and either a first or second logical signal appears at the output terminal, depending on whether the first or second fuse is cut, wherein the first logical signal is recognizable by an electronic device as "1", and the second logical signal is recognizable by the electronic device as "0",
the first fuse and the second fuse each comprise a material composition having a specific electrical resistance, such that a layer of the material of the first fuse as initially formed, has a first sheet resistance, and a layer of material of the second fuse as initially formed, has a second sheet resistance different from the first sheet resistance, and each fuse has substantially the same planar dimensions, and
the first and second sheet resistances are chosen so that when the first ends of the first and second fuses as initially formed are connected serially at the output terminal, and the first and second voltages are applied to the second ends of the serially connected first and second fuses, a current flows through the serially connected first and second fuses and causes voltage drops along the first and second fuses so as to output a third voltage at the output terminal, wherein the third voltage is determined solely by a ratio between the first and second sheet resistances to be either closer to the first voltage than the second voltage so that the electronic device can recognize the third voltage as the first logical signal "1" or closer to the second voltage than the first voltage so that the electronic device can recognize the third voltage as the second logical signal "0".

2. The fuse circuit according to claim 1, wherein the material layer of one of the first fuse or the second fuse comprises a layer of low-resistance polysilicon and the material layer of another of the first or second fuses comprises a layer of high-resistance polysilicon.

3. A semiconductor integrated circuit device integrated on a semiconductor substrate, comprising:
the fuse circuit according to claim 1; and
a logic circuit connected to the output terminal of the fuse circuit.

* * * * *